(12) United States Patent
Park et al.

(10) Patent No.: US 7,592,239 B2
(45) Date of Patent: Sep. 22, 2009

(54) FLEXIBLE SINGLE-CRYSTAL FILM AND METHOD OF MANUFACTURING THE SAME

(75) Inventors: Jong-Wan Park, Namyangju (KR); Jea-Gun Park, Sungnam (KR)

(73) Assignee: Industry University Cooperation Foundation-Hanyang University, Seoul (KR)

( * ) Notice: Subject to any disclaimer, the term of this patent is extended or adjusted under 35 U.S.C. 154(b) by 0 days.

(21) Appl. No.: 10/833,050

(22) Filed: Apr. 28, 2004

(65) Prior Publication Data
US 2004/0217423 A1 Nov. 4, 2004

(30) Foreign Application Priority Data
Apr. 30, 2003 (KR) .................. 10-2003-0027825
May 23, 2003 (KR) .................. 10-2003-0032841

(51) Int. Cl.
*H01L 21/20* (2006.01)

(52) U.S. Cl. .............. 438/479; 438/406; 438/455; 438/458; 438/459; 438/517; 257/347; 257/E21.088; 257/E21.122; 257/E21.32; 257/E27.112

(58) Field of Classification Search .......... 438/458, 438/459, 460, 455, 478, 479, 406, 517; 437/173, 437/86, 974; 257/347, E21.088, E21.122, 257/E21.32, E27.112
See application file for complete search history.

(56) References Cited

U.S. PATENT DOCUMENTS

| | | | | |
|---|---|---|---|---|
| 5,213,657 A | * | 5/1993 | Abe et al. ................. | 438/8 |
| 5,232,870 A | * | 8/1993 | Ito et al. .................. | 438/455 |
| 5,307,190 A | | 4/1994 | Wakita et al. | |
| 5,412,493 A | | 5/1995 | Kunii et al. | |
| 5,572,045 A | | 11/1996 | Takahashi et al. | |
| 5,614,731 A | | 3/1997 | Uchikoga et al. | |
| 5,654,811 A | | 8/1997 | Spitzer et al. | |
| 5,981,400 A | * | 11/1999 | Lo ........................... | 438/745 |
| 6,043,800 A | | 3/2000 | Spitzer et al. | |
| 6,100,166 A | | 8/2000 | Sakaguchi et al. | |
| 6,221,738 B1 | * | 4/2001 | Sakaguchi et al. ......... | 438/455 |
| 6,258,698 B1 | * | 7/2001 | Iwasaki et al. ............ | 438/455 |
| 6,362,076 B1 | * | 3/2002 | Inazuki et al. ............ | 438/458 |
| 6,365,916 B1 | | 4/2002 | Zhong et al. | |

(Continued)

FOREIGN PATENT DOCUMENTS

CN 1313949 9/2001

(Continued)

OTHER PUBLICATIONS

Restriction Requirement issued in U.S. Appl. No. 10/833,051 on Sep. 13, 2005.

(Continued)

*Primary Examiner*—Andy Huynh
(74) *Attorney, Agent, or Firm*—Portland IP Law LLC

(57) ABSTRACT

The present invention relates to a flexible single-crystal film and a method of manufacturing the same from a single-crystal wafer. That is, the present invention can manufacture a silicon-on-insulator (SOI) wafer comprising a base wafer, one or more buried insulator layers, and a single-crystal layer into a flexible single-crystal film with a desired thickness by employing various wafer thinning techniques. The method for manufacturing a flexible film comprises the steps of (i) providing a SOI wafer comprising a base wafer, one or more buried insulator layers on the base wafer, and a single-crystal layer on said one or more buried insulator layers, (ii) forming one or more protective insulator layers on said single-crystal layer, (iii) removing said base wafer, and (iv) removing one or more of the insulator layers.

14 Claims, 16 Drawing Sheets

U.S. PATENT DOCUMENTS

| | | |
|---|---|---|
| 6,566,160 B2 | 5/2003 | Yeh et al. |
| 6,576,926 B1 | 6/2003 | Yamazaki et al. |
| 6,605,827 B2 | 8/2003 | Katayama |
| 6,881,649 B2 * | 4/2005 | Kouma et al. ............... 438/460 |
| 6,998,329 B2 * | 2/2006 | Aga et al. .................. 438/458 |
| 7,274,413 B1 | 9/2007 | Sullivan et al. |
| 2002/0021392 A1 | 2/2002 | Ohtake et al. |
| 2002/0030189 A1 | 3/2002 | Ishikawa |
| 2002/0071086 A1 | 6/2002 | Kim et al. |
| 2002/0079495 A1 | 6/2002 | Sung |
| 2003/0062519 A1 | 4/2003 | Yamazaki et al. |
| 2003/0206256 A1 | 11/2003 | Drain et al. |
| 2003/0222334 A1 | 12/2003 | Ikeda et al. |
| 2004/0029358 A1 | 2/2004 | Park et al. |
| 2004/0070697 A1 | 4/2004 | Vu et al. |
| 2004/0142118 A1 | 7/2004 | Takechi |
| 2004/0217423 A1 | 11/2004 | Park et al. |
| 2004/0218133 A1 | 11/2004 | Park et al. |

FOREIGN PATENT DOCUMENTS

| | | |
|---|---|---|
| CN | 1313949 A | 9/2001 |
| JP | 03-250666 | 11/1991 |
| JP | 3250666 | 11/1991 |
| JP | 05-275329 | 10/1993 |
| JP | 5275329 | 10/1993 |
| JP | 8288522 | 11/1996 |
| JP | 11186187 | 7/1999 |
| JP | 11212116 | 8/1999 |
| JP | 2001-185528 | 7/2001 |
| JP | 2003-150087 | 5/2003 |
| KR | 100228720 | 8/1999 |
| KR | 20-0174717 | 1/2000 |
| KR | 20-174717 | 4/2000 |
| KR | 20-0174717 | 4/2000 |
| KR | 1020030053467 | 6/2003 |
| KR | 2004-14719 | 2/2004 |
| KR | 20040014719 | 2/2004 |
| KR | 10-2004-0064601 | 7/2004 |
| KR | 20040093949 | 11/2004 |
| KR | 1020040093948 | 11/2004 |
| KR | 1020040093949 | 11/2004 |
| KR | 20040100469 | 12/2004 |
| WO | WO00/06983 | 2/2000 |
| WO | WO 2004-042780 | 5/2004 |

OTHER PUBLICATIONS

Office Action issued in U.S. Appl. No. 10/833,051 on Mar. 27, 2006.
Office Action issued in U.S. Appl. No. 10/833,051 on Nov. 13, 2006.
Office Action issued in U.S. Appl. No. 10/833,051 on Apr. 30, 2007.
Final Office Action issued in U.S. Appl. No. 10/833,051 on Oct. 15, 2007.
Office Action issued in U.S. Appl. No. 10/833,051 on Dec. 3, 2007.
Office Action dated May 28, 2008 corresponding to U.S. Appl. No. 10/833,051.
Young, P (1993). RF Properties of Epitaxial Lift-Off HEMT Devices. IEEE Transactions on Electron Devices, vol. 40, No. 11, pp. 1905-1909.
Final Office Action issued Jun. 8, 2009 for the U.S. Appl. No. 10/833,051.

* cited by examiner

FLEXIBLE SINGLE-CRYSTAL FILM AND METHOD OF MANUFACTURING THE SAME

BACKGROUND OF THE INVENTION

1. Field of the Invention

The present invention relates to a flexible single-crystal film and a method of manufacturing the same from a single-crystal wafer. That is, the present invention can manufacture a silicon-on-insulator (SOI) wafer comprising a base wafer, one or more buried insulator layers, and a single-crystal layer into a flexible single-crystal film with a desired thickness by employing various wafer thinning techniques.

The present invention also relates to manufacturing a flexible film on which various electronic devices are manufactured from a single-crystal semiconductor wafer. That is, the present invention can manufacture a flexible single-crystal film with desired thickness having various electronic devices by employing a variety of wafer thinning techniques once the electronic devices of desired characteristics on the SOI wafer, comprising the base wafer, buried insulator layers, and single-crystal layer, are constructed.

2. Description of the Prior Art

At present, electronic apparatuses have drastically improved in design, shifting from lightweight and compact designs to overall and enhanced flexibility. With the growth of mobile wireless Internet and electronic commercial transactions, demand has particularly increased for new flexible displays. As such, the present invention can be applied to foldable radiotelephones, PDAs, flexible electronic books, electronic newspapers, and the like commercially. The present invention can also be applied to electronic blackboards, displays for CAD/CAM, electric signs, and electric billboards.

In spite of the demand for such flexible electronic apparatuses, the major reason for the delay in developing a flexible electronic apparatus is that there is no substrate material from which electronic devices of the desired characteristics are stably manufactured. For example, in the case of a flexible LCD display, the flexible substrate is required in order to stably manufacture a TFT (thin film transistor) array. Up to now, there have been methods for manufacturing the TFT array by forming amorphous silicon or poly-silicon for manufacturing electronic devices on a flexible, transparent plastic substrate under low temperature or by transferring poly-silicon TFT array manufactured on a glass substrate into flexible plastic substrate, and for manufacturing organic TFT using a smooth and organic semiconductor.

However, in the case of electronic devices using a plastic substrate or a plastic substrate after manufacturing electronic devices on a glass substrate, deformation can occur due to different thermal expansion coefficients between organic substrate and inorganic electronic devices. Organic semiconductors, in fact, can cause the electronic devices to lack the desired characteristics.

SUMMARY OF THE INVENTION

It is an object of the present invention to manufacture a flexible single-crystal film, which enables the electronic devices of desired characteristics to be manufactured and to be flexible enough, to solve the above-mentioned problems, specifically, by using a single-crystal wafer.

Another object of the present invention is to stably manufacture a flexible film wherein various desired electronic devices are manufactured on the single-crystal layer by a simple technique in order to embody the desired characteristics.

A further object of the present invention is to improve productivity and reduce the cost of production by simplifying the manufacturing process of the flexible single-crystal film.

The above objects can be accomplished by providing a flexible film comprising a single-crystal layer which is manufactured from a single-crystal wafer. The flexible film may comprise a flexible single-crystal layer manufactured from a single-crystal wafer and one or more flexible insulator layers on the lower and/or upper surface of the single-crystal wafer.

The flexible single-crystal film according to the present invention may be a pure, defect-free, flexible single-crystal film manufactured from a SOI wafer, which comprises a base wafer, one or more insulator layers on the base wafer, and a single-crystal layer on the one or more insulator layers, by removing the base wafer through a variety of thinning techniques, wherein the flexible single-crystal film according to the present invention enables the thickness of the single-crystal layer to be controlled, for example, within the range from several ten nanometers up to several ten micrometers, when manufacturing the SOI wafer by the SOI manufacturing process. The single-crystal layer of the present invention may be a single-crystal layer of silicon or a compound semiconductor, such as gallium arsenide.

The flexible single-crystal film according to the present invention comprises a flexible single-crystal layer manufactured from a single-crystal wafer and one or more device layer formed on a surface of the single-crystal layer, wherein various electronic devices are manufactured on the flexible single-crystal layer.

The flexible single-crystal film, on which the various electronic devices are manufactured according to the present invention, may be manufactured by removing the base wafer of the SOI wafer. This can be achieved by manufacturing the electronic devices of desired characteristics on the single-crystal layer of the SOI wafer using a general semiconductor manufacturing process.

The method for manufacturing a flexible film comprises the steps of (i) providing a SOI wafer comprising a base wafer, one or more buried insulator layers on the base wafer, and a single-crystal layer on the one or more buried insulator layers, (ii) forming one or more protective insulator layers on the single-crystal layer, (iii) removing the base wafer, and (iv) removing one or more of the insulator layers. The step of removing the base wafer may comprise the step of removing the entire base wafer by wet etching it with KOH. The base wafer may removed by grinding the base wafer to a desired thickness, and the remaining base wafer after grinding may be removed by wet etching it with KOH. In addition, the step of forming the one or more protective insulator layers on the single-crystal layer may comprise the steps of forming an oxide film on the single-crystal layer, and forming a nitride film on the oxide film. The step of removing one or more of the insulator layers may comprise the step of removing all of the insulator layers by wet etching them with HF.

The method for manufacturing a flexible film using the jig according to the present invention comprises the steps of (i) providing a SOI wafer comprising a base wafer, one or more buried insulator layers on the base wafer, and a single-crystal layer on the one or more buried insulator layers, (ii) holding the SOI wafer with a jig to expose the lower surface of the base wafer, and (iii) removing the base wafer by etching it. When the SOI wafer is held with the jig, specifically, the edges, the entire lower surface of the base wafer is exposed and etched. The base wafer may be etched after holding the peripheral portion of the SOI wafer with the jig to expose a portion of the lower surface of the base wafer. The base wafer may be removed by cutting the peripheral portion which is held by the jig. The base wafer may be removed by wet etching it with KOH, and one or more of the insulator layers may be removed by wet etching them with HF.

The method for manufacturing a flexible film by grinding and using the jig according to the present invention comprises the steps of (i) providing a SOI wafer comprising a base wafer, one or more buried insulator layers on the base wafer, and a single-crystal layer on the one or more buried insulator layers; (ii) bonding a supporting wafer to the single-crystal layer of the SOI wafer; and (iii) removing the base wafer and the supporting wafer. The base wafer may be removed by grinding and etching it. One or more protective insulator layers may be formed on the single-crystal layer before bonding a supporting wafer to said single-crystal layer of said SOI wafer. Also, the method for manufacturing a flexible film by grinding and using the jig according to the present invention comprises the steps of (i) providing a SOI wafer comprising a base wafer, one or more buried insulator layers on the base wafer, and a single-crystal layer on the one or more buried insulator layers; (ii) grinding the base wafer to a predetermined thickness; (iii) holding the SOI wafer with a jig to expose the lower surface of the remaining base wafer after grinding; (iv) and removing the remaining base wafer by wet etching it. One or more protective insulator layers may be formed on the single-crystal layer before grinding the base wafer. The one or more buried insulator layers and/or the one or more protective insulator layers may be removed after removing the base wafer.

The method for manufacturing a flexible film on which electronic devices are manufactured according to the present invention comprises the steps of (i) providing a SOI wafer comprising a base wafer, one or more buried insulator layers on the base wafer, and a single-crystal layer on the one or more buried insulator layers, (ii) forming one or more device layers by manufacturing electronic devices on the single-crystal layer, (iii) forming a protective film for the devices on the device layer, and (iv) removing the base wafer. The base wafer may be removed by the various methods described above.

The SOI wafer used in the present invention may be commercially available, or manufactured from a SOI wafer through various methods. The step of providing the SOI wafer may comprise the steps of (i) providing the base wafer and a bonding wafer, (ii) forming one or more buried insulator layers on the base wafer, (iii) implanting hydrogen ions into the bonding wafer, (iv) bonding the base wafer and the bonding wafer, (v) cleaving the bonding wafer, and (vi) etching the cleaved surface of the bonding wafer to manufacture the SOI wafer wherein the single-crystal layer is formed on the buried insulator layers of the base wafer. The thickness of the single-crystal layer can be controlled by controlling the depth of the cleaving and etching the cleaved surface of the bonding wafer. For the method of manufacturing a bonded SOI wafer, please refer to U.S. patent application Ser. No. 10/391,297.

The jig used in etching a wafer comprises a lower plate; an upper plate having one or more through holes; and fixtures for joining the lower and upper plates together, wherein the wafer is positioned between the lower plate and the upper plate, the portion of the wafer to be etched is exposed through the one or more through holes, the wafer and the one or more through holes are sealed, and an etching solution is supplied through the one or more through holes. The upper plate is provided with a bath for containing the etching solution, and the bath is communicated with the one or more through holes. A heater and a thermometer are provided in the bath.

DETAILED DESCRIPTION OF THE INVENTION

The process for manufacturing the flexible film from a single-crystal according to the present invention will now be explained in detail.

Embodiment 1

Figure 1:
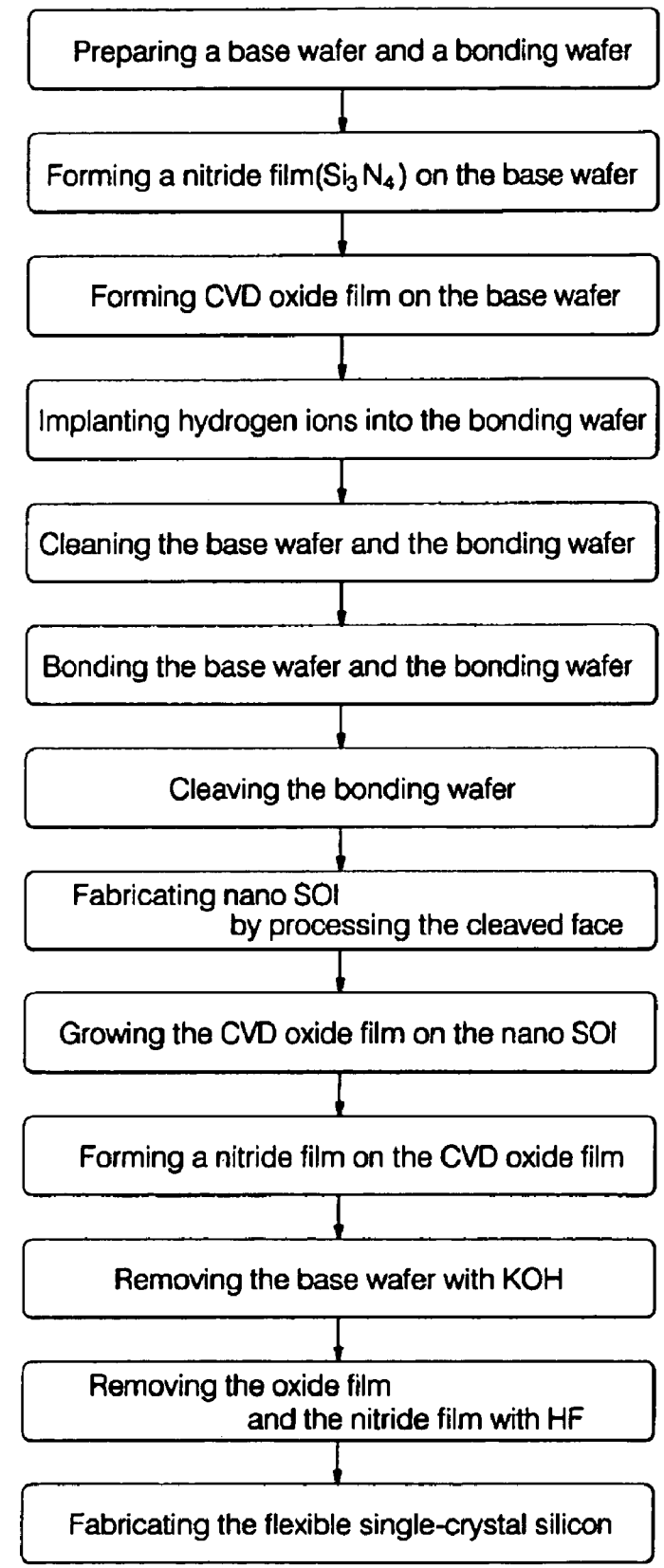
FIG. 1 shows a flow chart for manufacturing a flexible film according to Embodiment 1 of the present invention.
Figure 2:
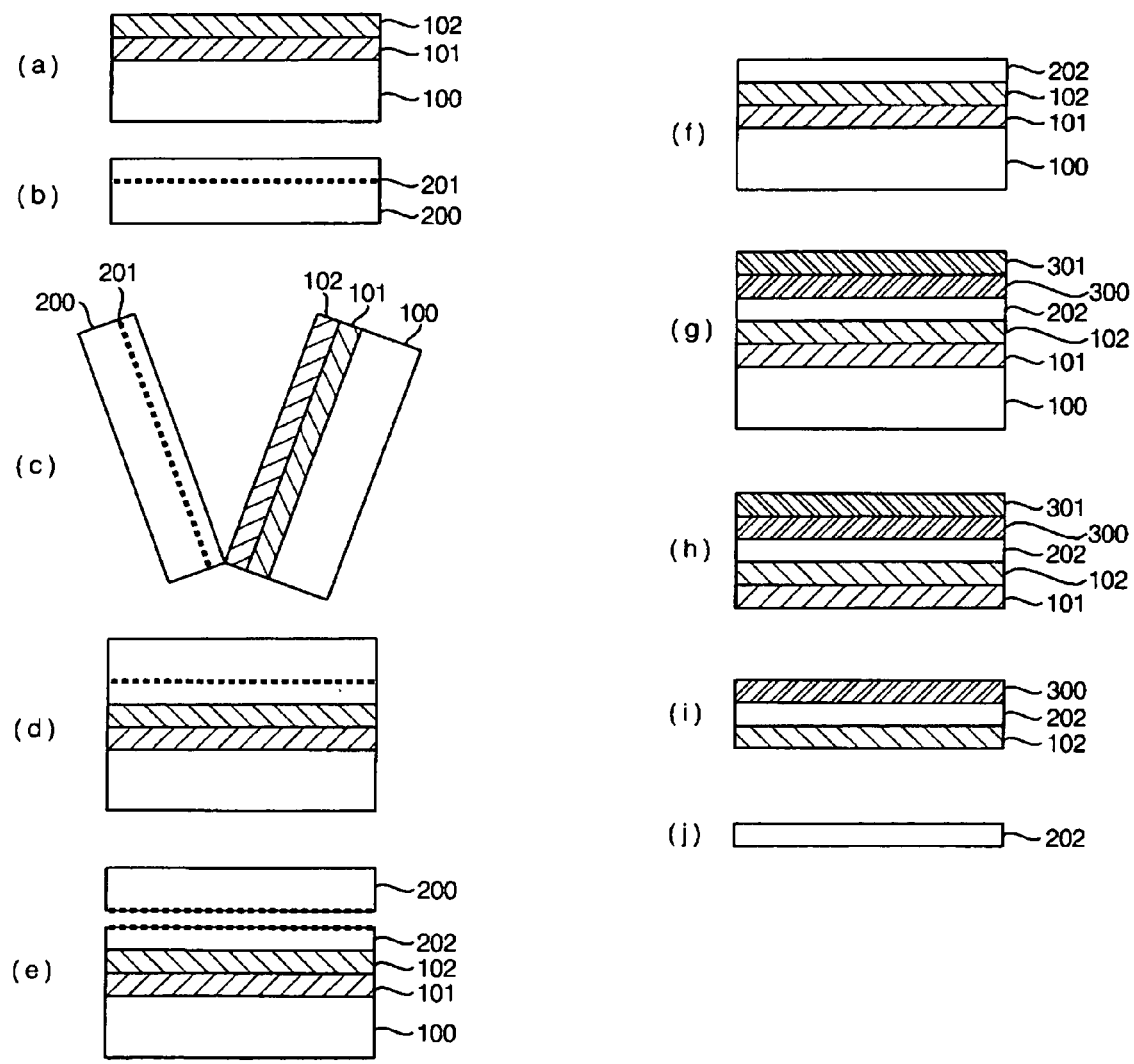
FIG. 2 shows views of the manufacturing process of a flexible film according to Embodiment 1 of the present invention.

Referring to FIGS. 1 and 2, the manufacturing process of the flexible single-crystal film according to the present invention is as follows.

A base wafer 100 and a bonding wafer 200 are provided as a bare silicon wafer. As shown in FIG. 2(a), such buried insulator layers as silicon nitride film ($Si_3N_4$) 101 and silicon oxide film 102 are formed on a surface of the base wafer with uniform thickness. The silicon oxide film 102 is formed on the silicon nitride film 101. The silicon oxide film 102 may be formed by using chemical vapor deposition. As shown in FIG. 2(b), the bonding wafer 200 is formed with an impurity ion implantation portion 201 by implanting impurity ions into the predetermined depth of the surface thereof. At this time, impurities such as hydrogen ions are implanted into the surface of a wafer by a low voltage ion implantation method, causing a projection range distance (Rp) of the implanted hydrogen ions formed near the surface of the bonding wafer, for example, in the range of 100 to 1000 nm.

The base wafer 100, on which the buried insulator layers are formed as above, and the bonding wafer 200, into the surface of which hydrogen ions are implanted, are cleaned, and then, these wafers 100, 200 are bonded to each other as shown in FIG. 2(c). At this time, the wafers 100, 200 are cleaned under hydrophilic condition in order to improve the bonding force. The wafers 100, 200 are bonded vertically, as shown in FIG. 2(c), immediately after cleaning. For vertical bonding, the base wafer 100 and the bonding wafer 200 are placed in front of each other and connected at one end. As shown in FIG. 2(d), two wafers are manufactured with one wafer overlapping the other.

As described above, by heat-treating the bonded wafers under low temperature, the impurity ion implantation portion of the bonding wafer is cleaved as shown in FIG. 2(e). A single-crystal layer 202 of silicon is manufactured by processing the cleaved surface to the desired thickness by etching, CMP (chemical mechanical polishing), and the like (see FIG. 2(f)). The thickness of the single-crystal layer of silicon can be controlled according to need.

As shown in FIG. 2(g), protective insulator layers 300, 301 are formed on the single-crystal layer 202 manufactured on the base wafer 100, as described above. The protective insulator layers, which protect the single-crystal layer of silicon from being etched when the base wafer is removed by wet etching, includes an oxide film 300 and a nitride film 301 thereon.

After the protective insulator layers 300, 301 are formed on the single-crystal layer of silicon, the base wafer 100 is removed by wet etching it with KOH solution. The etching condition can be adjusted by controlling the etching temperature, the concentration of the etching solution, and the like.

Once removing the base wafer as described above, the insulator layers are left on the upper and lower surfaces of the single-crystal layer of silicon as shown in FIG. 2(h) so that the single-crystal layer and insulator layers become thin and flexible. The single-crystal layer of silicon is left alone by removing all of the buried and protective insulator layers by wet etching the films with HF solution, so that the pure flexible single-crystal film of silicon is obtained, as shown in FIG. 2(j). The flexible film, including the buried or protective insulator layers and the single-crystal layer of silicon, is also obtained by etching and removing the buried insulator layers or the protective insulator layers on the single-crystal layer of silicon.

Figure 3:
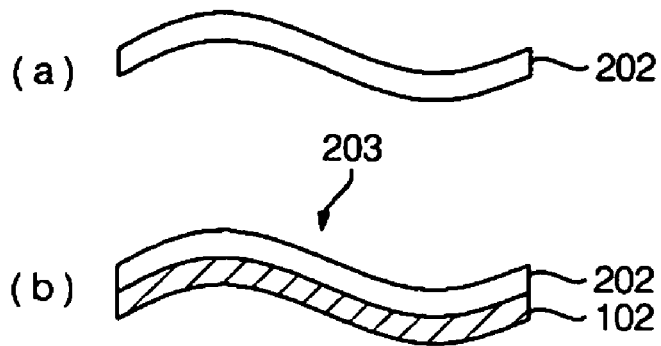
FIG. 3 shows views of a flexible film manufactured according to Embodiment 1 of the present invention.

Since it is possible to control the thickness of the flexible film from several ten nanometers up to several ten micrometers, the pure single-crystal film 202 of silicon having excellent flexibility as in FIG. 3(a) and the flexible film 203 including the buried insulator layer 102 and the single-crystal layer 202 of silicon in FIG. 3(b), are applicable to a variety of fields. Also, the buried insulator layer 102 of the flexible film 203 protects the single-crystal layer 202 of silicon during handling.

Figure 4:
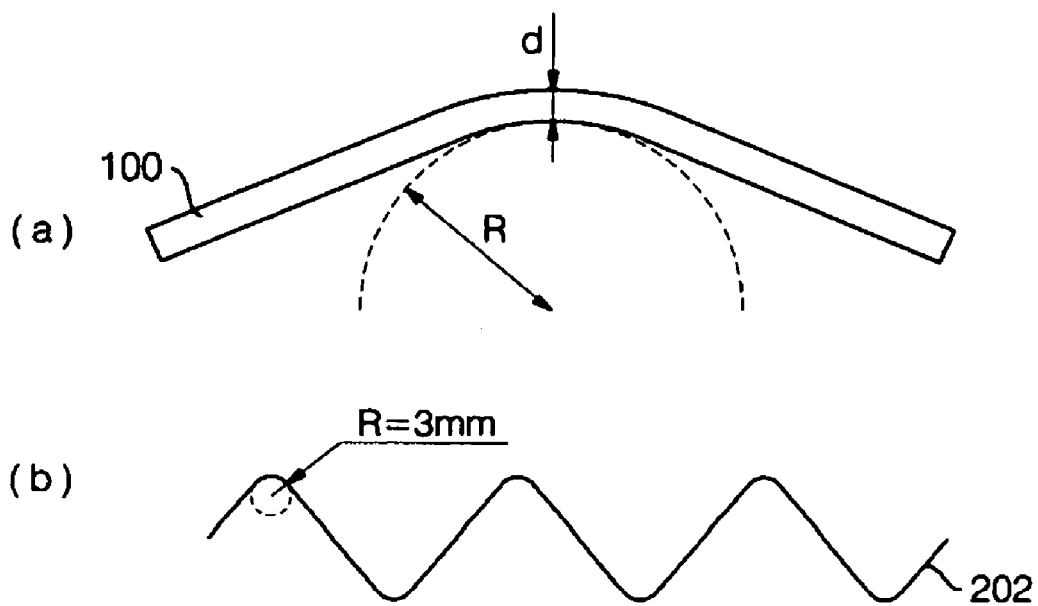
FIG. 4 shows views illustrating the method of measuring the flexibility of a flexible film manufactured according to the present invention.

Theoretical flexibility of the single-crystal film of silicon, the radius of curvature, at which the single-crystal film of silicon is fractured when bent, can be calculated. As shown in FIG. 4(a), the stress when the silicon wafer with a thickness of d is bent to the radius of curvature of R, can be calculated as follows:

$$\sigma = (d/2R)E (<\sigma_y \text{ and } <\sigma_f)$$

where, $\sigma$ is stress, d is thickness, R is the radius of curvature, E is Young's modulus, $\sigma_y$ is yield stress, and $\sigma_f$ is fracture stress.

In general, E is 190 GPa, $\sigma_y$ is 6.9 GPa, and $\sigma_f$ is 2.8 GPa. Hence, the theoretical fracture curvature-radius of the single-crystal film of silicon of e.g. 5 µm in thickness is estimated to be 0.17 mm. It was actually confirmed that the silicon film of 5 µm in thickness according to the present invention can be bent without fracture at least at the radius of curvature of less than 3 mm (see FIG. 4(b)). Therefore, it is noted that the flexible single-crystal film of silicon according to the present invention can possess the desired flexibility. The flexible single-crystal film according to the following embodiments of the present invention also meets with the same results.

Embodiment 2

Figure 5:
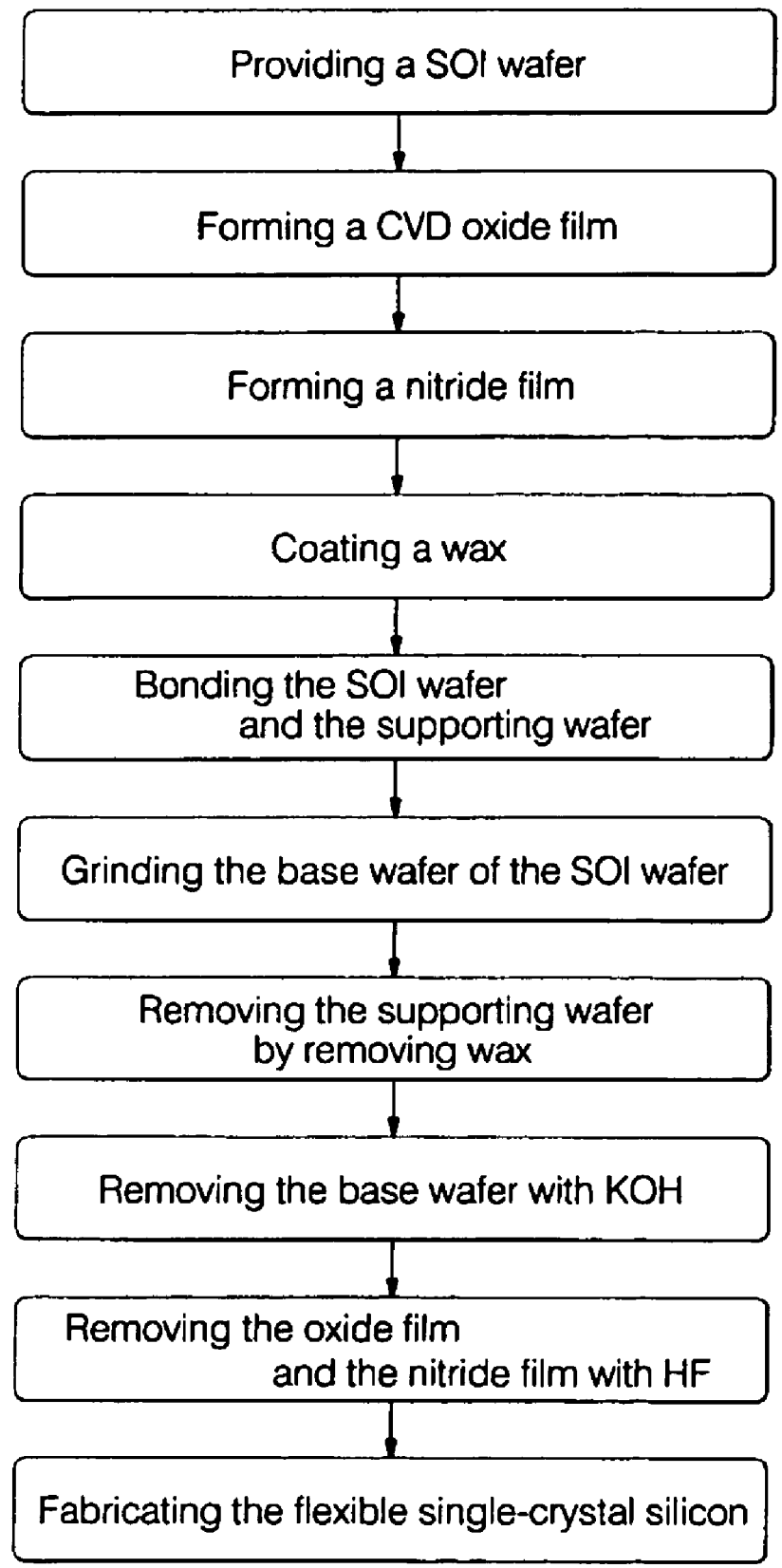
FIG. 5 shows a flow chart for manufacturing a flexible film according to Embodiment 2 of the present invention.
Figure 6:
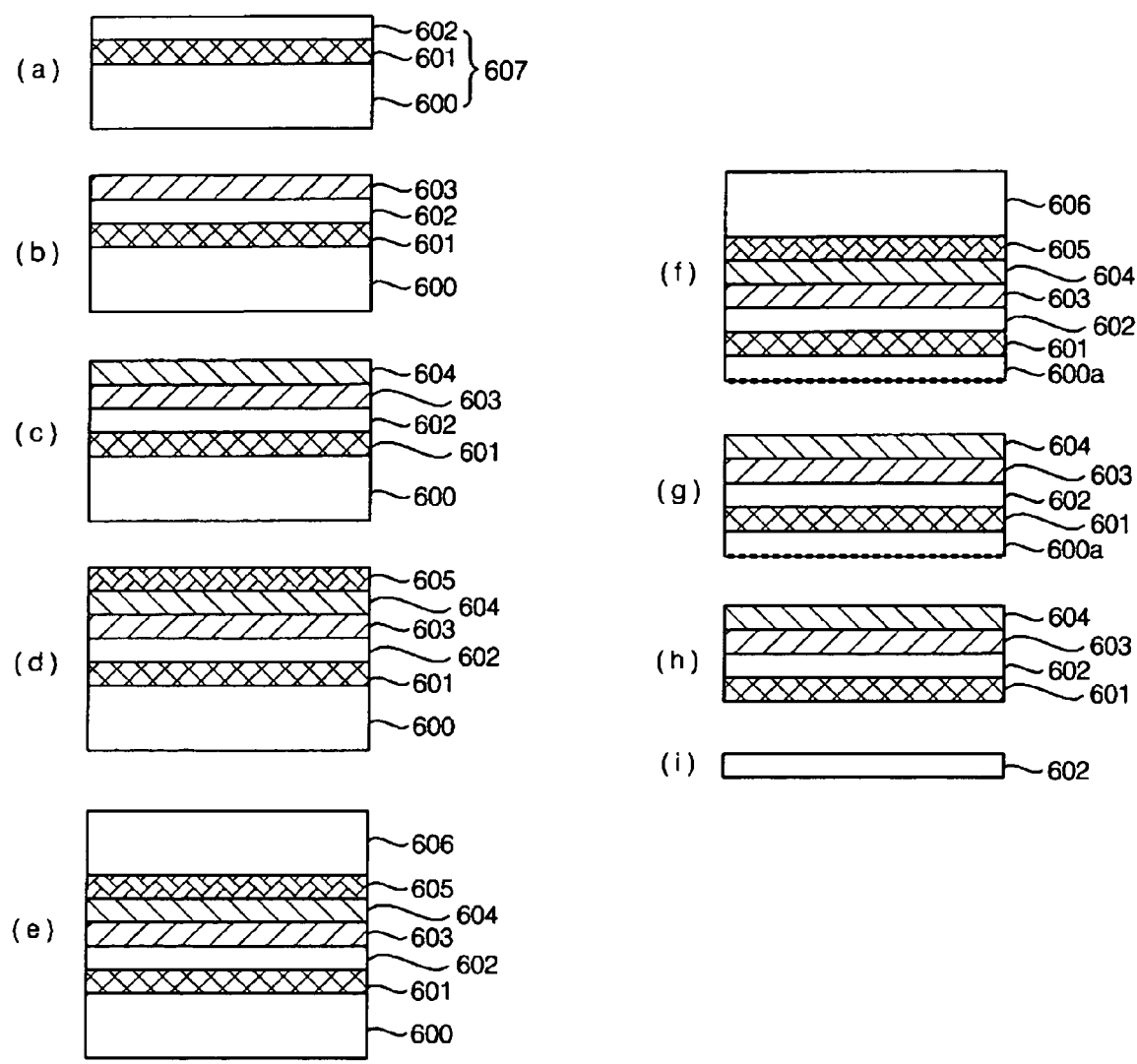
FIG. 6 shows views of the manufacturing process of a flexible film according to Embodiment 2 of the present invention.

Referring to FIGS. 5 and 6, the manufacturing process of the flexible single-crystal film by grinding according to the present invention is as follows.

As shown in FIG. 6(a), a SOI wafer comprising a base wafer 600, a buried insulator layer 601 formed on the base wafer 600, and a single-crystal layer 602 of silicon formed on the buried insulator layer 601 is provided. The SOI wafer may be manufactured from a SOI wafer by bonding or a SIMOX (separation by implanted oxygen) wafer, or may be commercially available. Thick insulator layers are used. The thickness of the single-crystal layer is adjusted according to applications.

Protective insulator layers such as an oxide film 603 and a nitride film 604, which protect the single-crystal layer of silicon when a base wafer is removed, are formed on the SOI wafer, prepared as above. The oxide film 603 is formed, and then the nitride film 604 is formed on the oxide film 603 (FIG. 6(c)).

After a bonding agent such as wax 605 is coated on the protective insulator layer, formed as above (FIG. 6(d)), a supporting wafer 606 is bonded thereon (FIG. 6(e)). The wax which is soluble in water may be selected. The supporting wafer is bonded by vertical or horizontal bonding. In the post grinding process, the supporting wafer protects the SOI wafer and facilitates the process. Since the SOI wafer becomes thin as it is ground, it may be fractured in a chuck of a grinding machine. Therefore, if the SOI wafer with the supporting wafer bonded is ground, the wafer is safely held in the chuck, though thinning the SOI wafer.

With the supporting wafer 606 bonded, as shown in FIG. 6(f), the base wafer 600 is ground to the desired thickness. The thickness can be desirously adjusted in grinding, for example from 50 µm to 200 µm. The supporting wafer 606 may be not used if the thickness of the remaining base wafer after grinding is thick.

After grinding the base wafer 600, the supporting wafer 606 is removed by dissolving the wax with aqueous solutions or a chemical agent (FIG. 6(g)).

After removing the supporting wafer 606, the remaining base wafer 600a after grinding is removed by wet etching it with a KOH solution (FIG. 6(h)).

As shown in FIG. 6(h), the insulator layers 604, 603, 601 are left on the upper and lower surfaces of the single-crystal layer 602 of silicon after the base wafer is removed, the thickness of the single-crystal layer and the insulator layers become thin enough so that the desired flexibility can be obtained. By removing all of the insulator layers on the upper and lower surfaces of the single-crystal layer of silicon by wet etching the films with HF solution, as shown in FIG. 6(i), the pure flexible single-crystal film is obtained. Also, if the buried insulator layer or the protective insulator layers on the single-crystal layer of silicon are removed by etching, the flexible film including the insulator layer(s) and the single-crystal layer of silicon is obtained.

If the flexible film is manufactured by such a method according to the present invention, the etching time can be significantly reduced. Since the base wafer is ground to the desired thickness, an etching flatness is desirable. Also, according to the present invention, the flexible single-crystal film is easily manufactured from a commercially available SOI wafer by using a thinning method.

Embodiment 3

Figure 8:
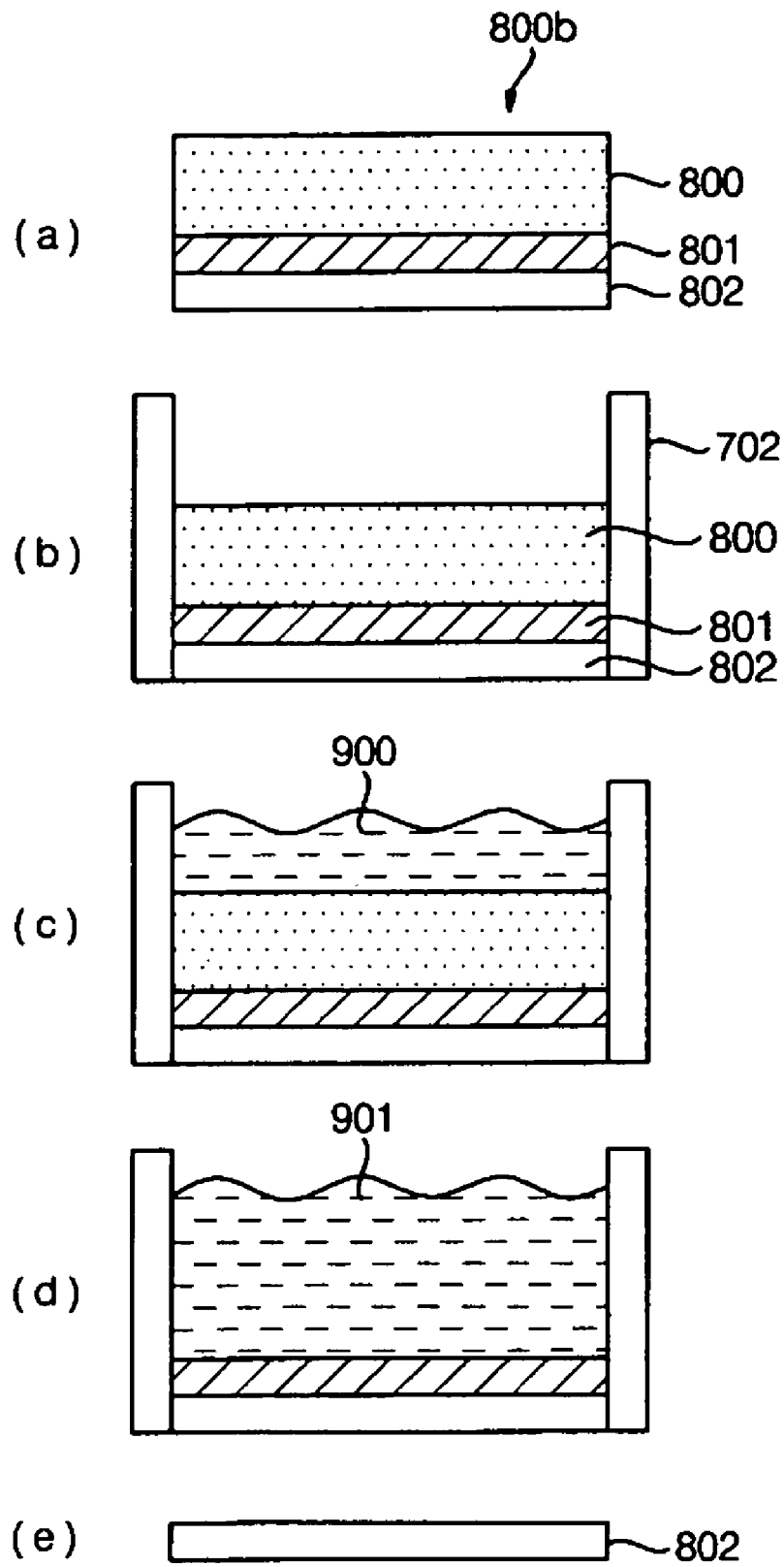
FIG. 8 shows views illustrating the manufacturing process of a flexible film by etching the entire surface of a base wafer, according to Embodiment 3 of the present invention.
Figure 9:
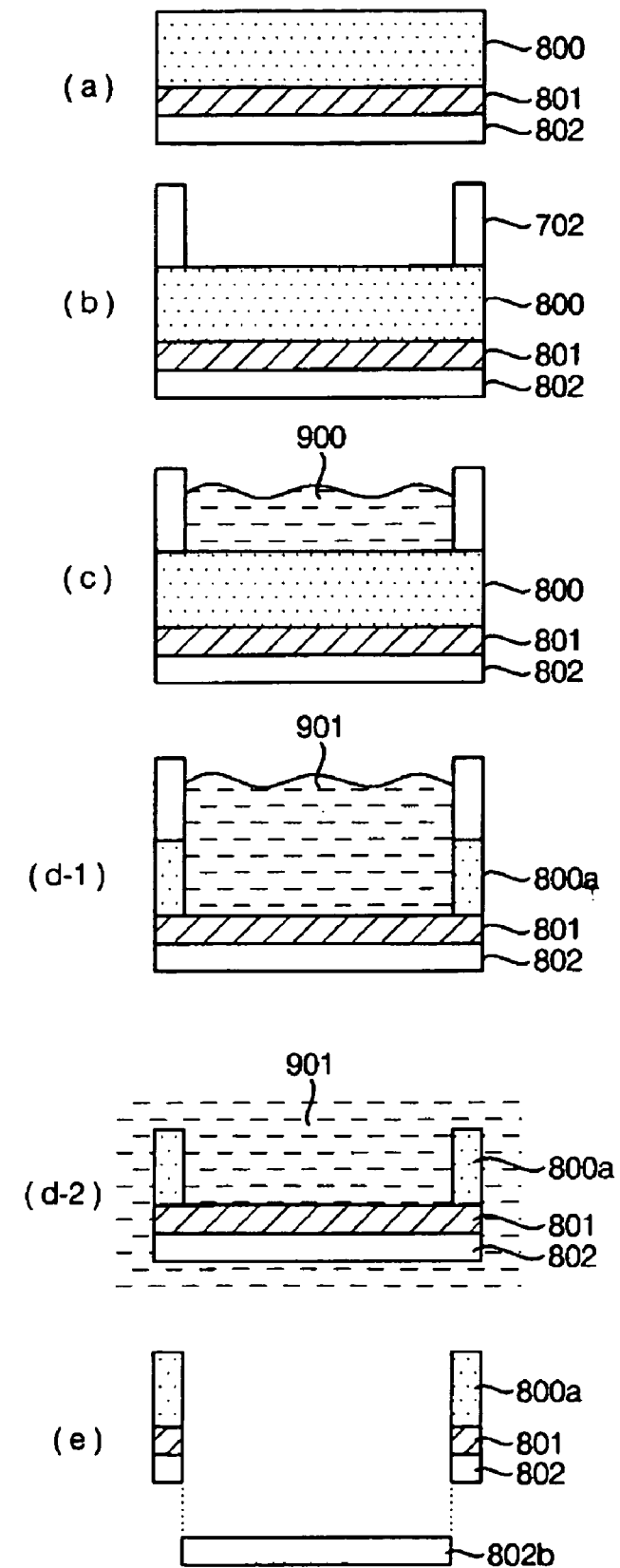
FIG. 9 shows views illustrating the manufacturing process of a flexible film by etching a portion of the surface of the base wafer, according to Embodiment 3 of the present invention.

Referring to FIGS. 8 and 9, the manufacturing process of the flexible single-crystal film using the jig according to the present invention is as set forth below.

Figure 7:
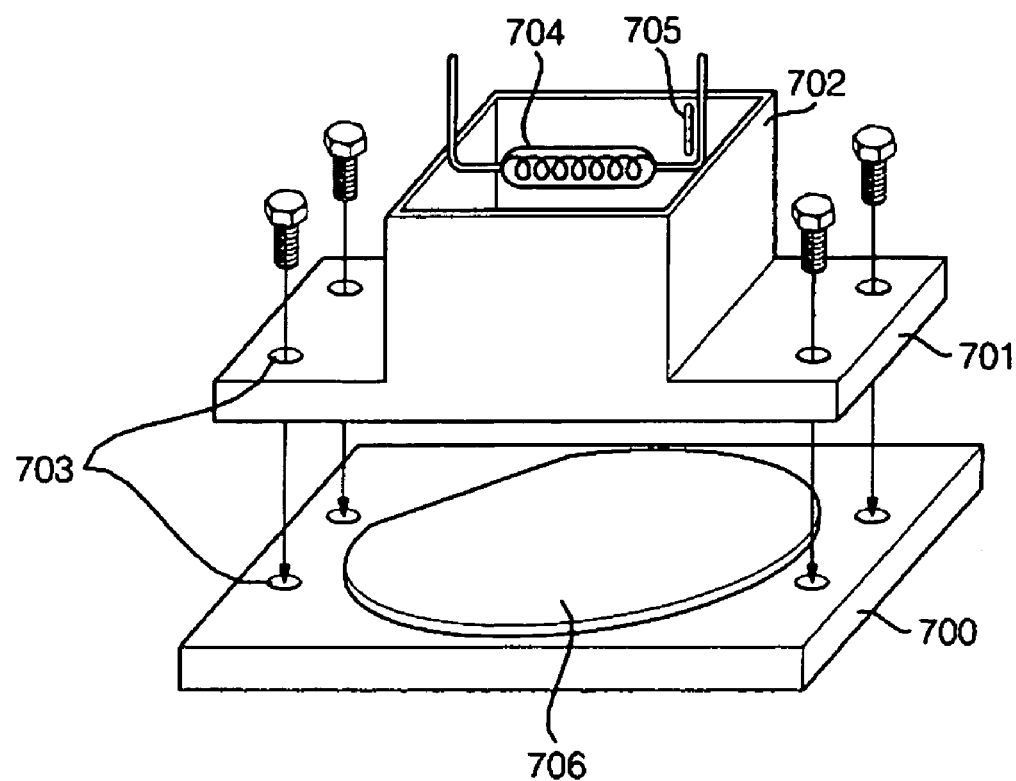
FIG. 7 shows a perspective view of a jig used in the present invention.

First, the jig used in the present invention will be explained. As shown in FIG. 7, the jig comprises a lower plate 700 and an upper plate 701 wherein a wafer 706 is installed therebetween. These plates 700, 701 are made from material that is stable against chemical agents, such as, Teflon. The upper plate 701 is provided with a bath 702 for containing chemical solution when the upper and lower plates are joined together. The bottom of the bath 702 includes a through hole through which the portion of the wafer to be etched is exposed. The wafer and the through hole are sealed. The through hole of the bath 702 can be manufactured into a tube or other various shapes such as rectangular and circular cylinders. Fixtures 703 are provided for joining the lower and upper plates together.

Using such a jig, a single side of the wafer can be removed by wet etching. The wafer 706 is positioned on the lower plate 700 wherein the wafer surface to be removed by etching faces the upper plate 701. After the lower and upper plates are joined and fixed to each other, the wafer surface is removed by supplying an etching solution into the bath 702. According to the etching condition, a heater 704 and thermometer 705 coated with Teflon may be provided in the bath 702 to control the etching temperature.

Referring to FIG. 8, the removal process by etching an entire surface of the base wafer using the jig is as follows.

The SOI wafer comprising a base wafer 800, an insulator layer 801 formed on the base wafer, and a single-crystal layer 802 of silicon formed on the insulator layer is prepared, wherein the surface of the SOI wafer to be removed by etching faces upward. As shown in FIG. 8(b), the edges of the SOI wafer is held with the jig so that the entire surface of the base wafer to be removed by etching is exposed to the bath of the upper plate.

A KOH solution 900 is supplied onto the exposed surface of the base wafer so that the base wafer is removed by etching as shown in FIG. 8(c). By draining the KOH solution 900 from and supplying a HF solution 901 onto the exposed surface, the insulator layer 801 is removed by etching so that the pure, flexible, single-crystal film of silicon is obtained (FIG. 8(c)). The removal of the insulator layer with the HF solution may be performed by dipping the entire SOI wafer without the jig in the HF solution.

By etching only with the KOH in the steps described above, the flexible film including the insulator layer and the single-crystal layer of silicon can be obtained.

Referring to FIG. 9, the removal process by etching a portion of the base wafer using the jig will be explained in more detail as below.

As shown in FIG. 9(a), the SOI wafer comprising the base wafer 800, the insulator layer 801 formed on the base wafer 800, and the single-crystal layer 802 of silicon formed on the insulator layer is prepared. The jig is positioned and pressed on the peripheral portion of the backside of the SOI wafer so that a portion of the surface to be removed by etching is exposed (see FIG. 9(b)).

The KOH solution 900 is supplied onto the exposed surface of the base wafer so that the base wafer is removed by etching as shown in FIG. 9(c). By draining the KOH solution from and supplying the HF solution onto the exposed surface, the insulator layer is removed by etching (see FIG. 9(d-1)). That is, the exposed surface of the base wafer is removed by etching, and the insulator layer functions as an etching protective layer. The removal of the insulator layer with the HF solution may be performed by dipping the entire SOI wafer without the jig in the HF solution (see FIG. 9(d-2)).

The pure, flexible single-crystal film of silicon is obtained by cutting the peripheral portion of the base wafer, not removed by etching (see FIG. 9(e)).

Also, by etching only with the KOH in the steps described above and cutting the peripheral portion of the base wafer, the flexible film including the insulator layer and the single-crystal layer of silicon can be obtained.

The flexible single-crystal film can be easily manufactured by etching and removing only one surface of the wafer by using the jig. That is, the processing steps can be reduced by etching the base wafer using the jig without additional processing. An unnecessary peripheral of a wafer can also be easily removed. The flexible film of the desired shape can be manufactured by changing the shape of the bath of the upper plate. That is, by etching a circular wafer, of which the peripheral portion is held with the jig having a rectangular cylinder-shaped bath for containing a chemical agent and by cutting the peripheral portion, a rectangular, flexible single-crystal film can be obtained.

Embodiment 4

Figure 10:
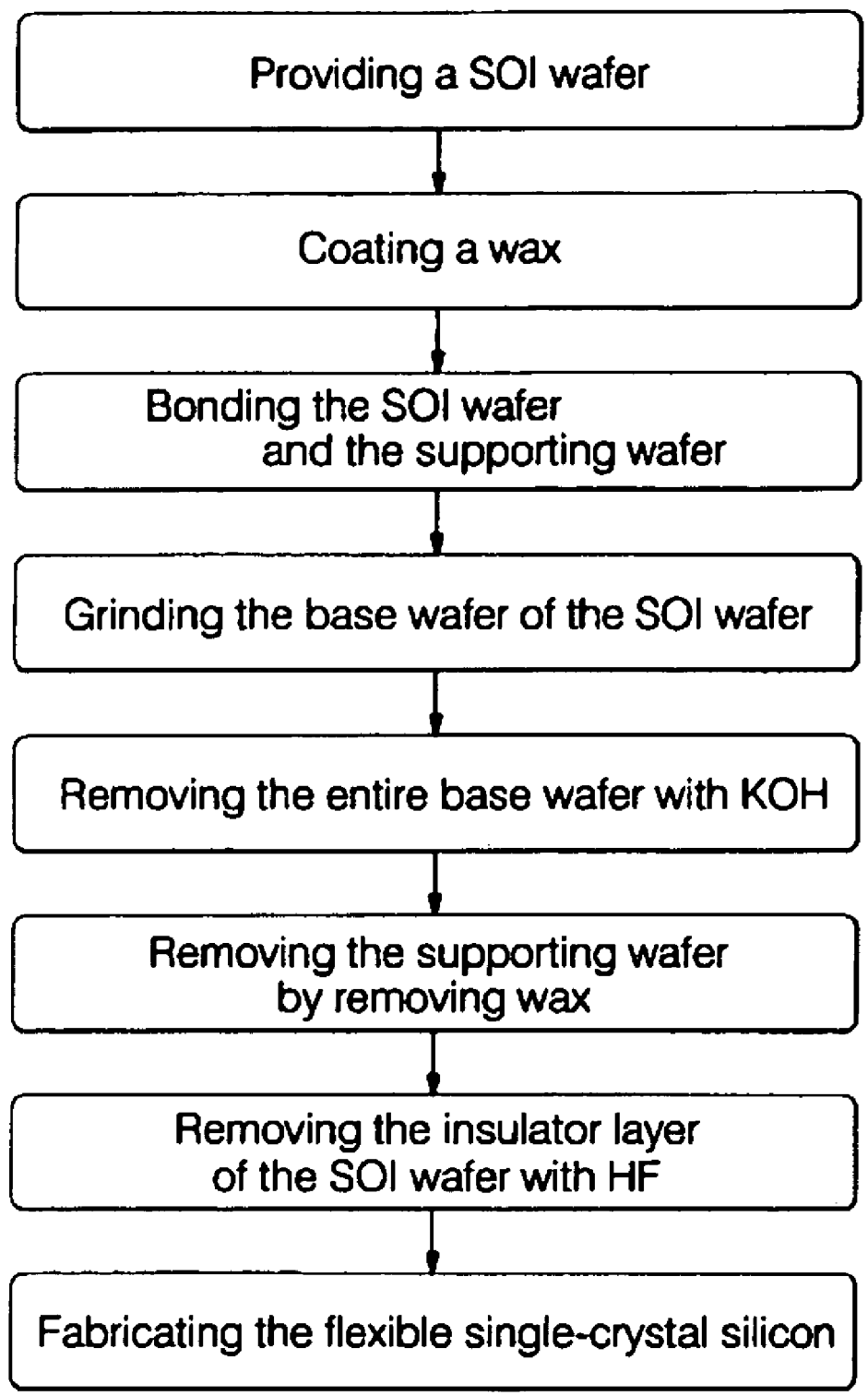
FIG. 10 shows a flow chart for manufacturing a flexible film according to Embodiment 4 of the present invention.
Figure 11A:
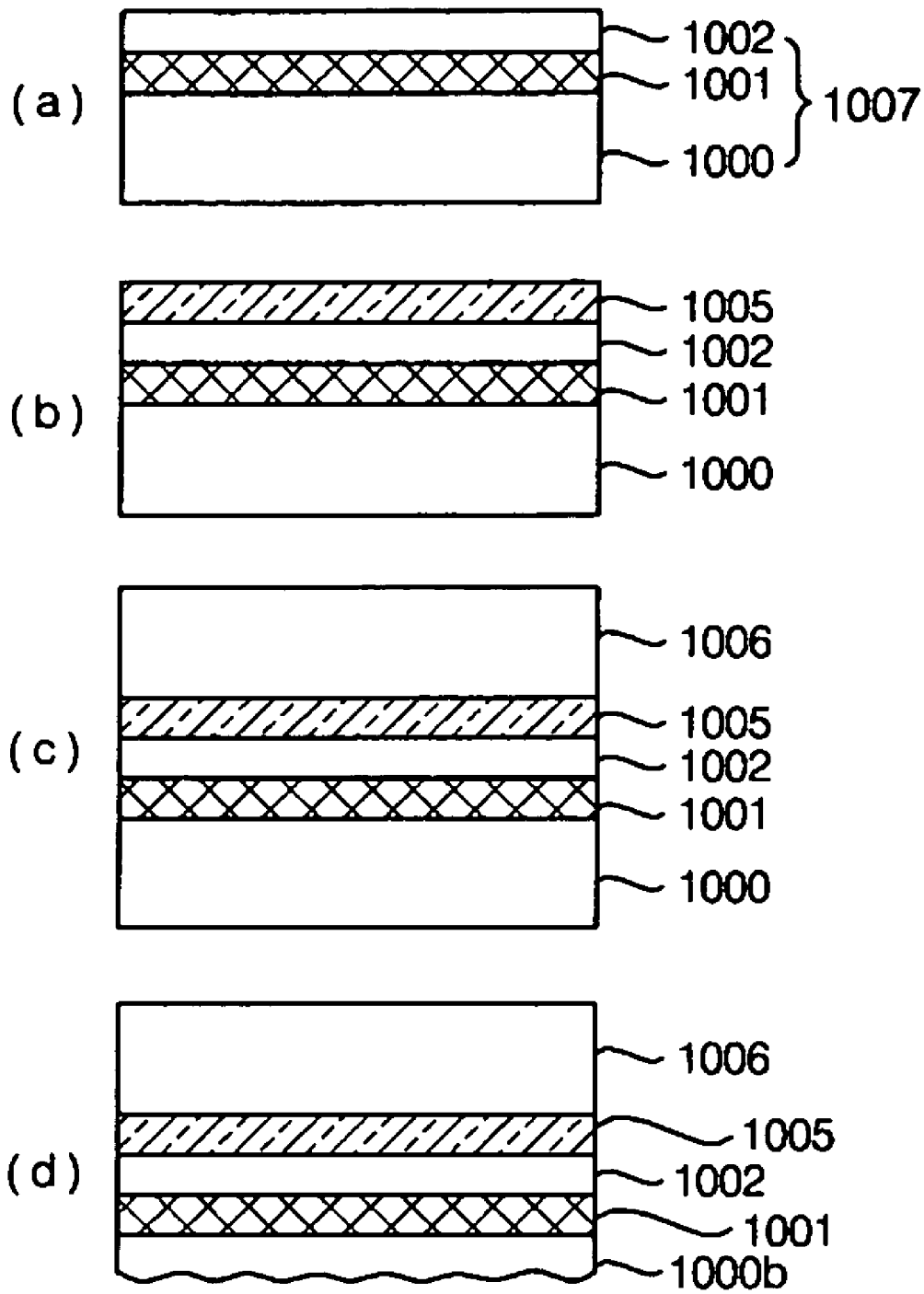
FIGS. 11A to 11C show views of the manufacturing processes of a flexible film according to Embodiment 4 of the present invention.
Figure 11B:
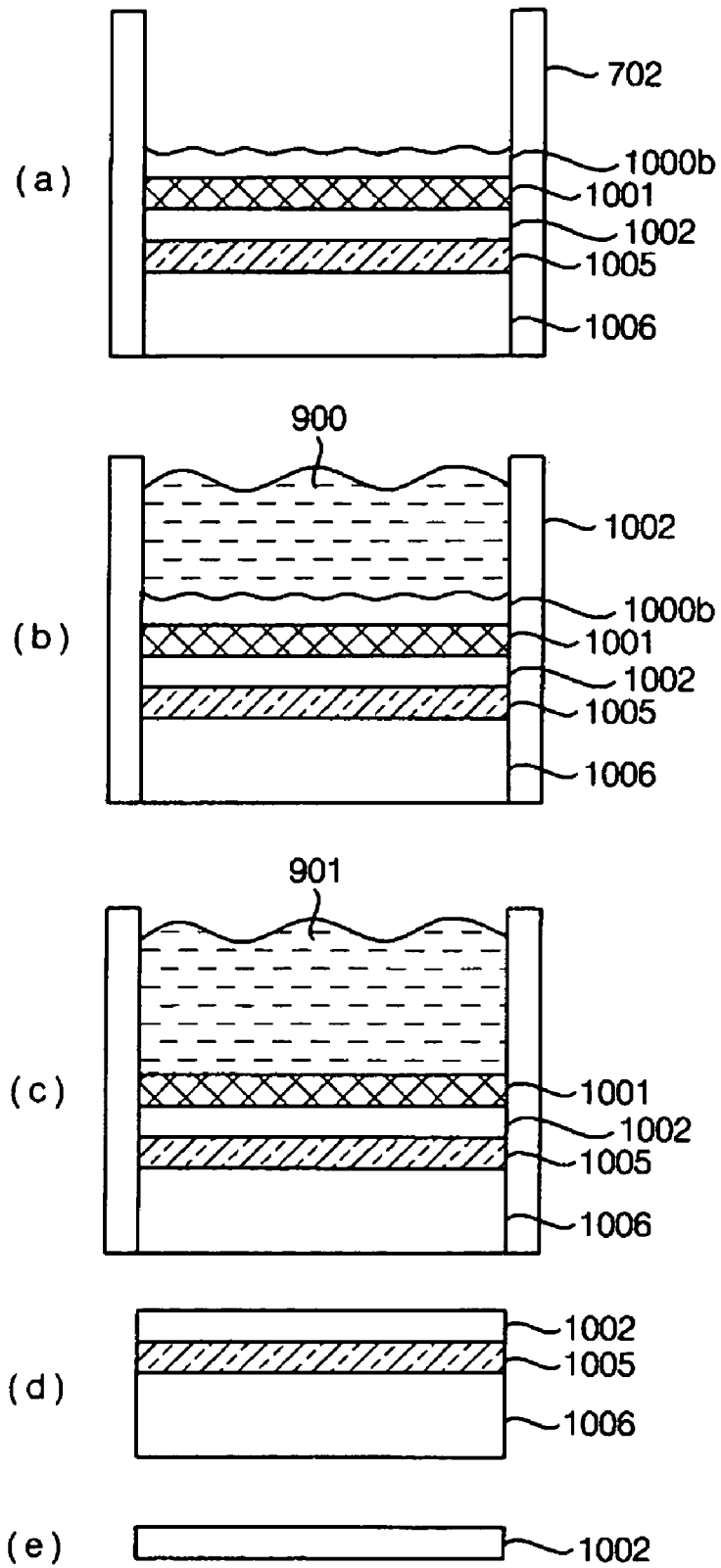
Figure 11C:
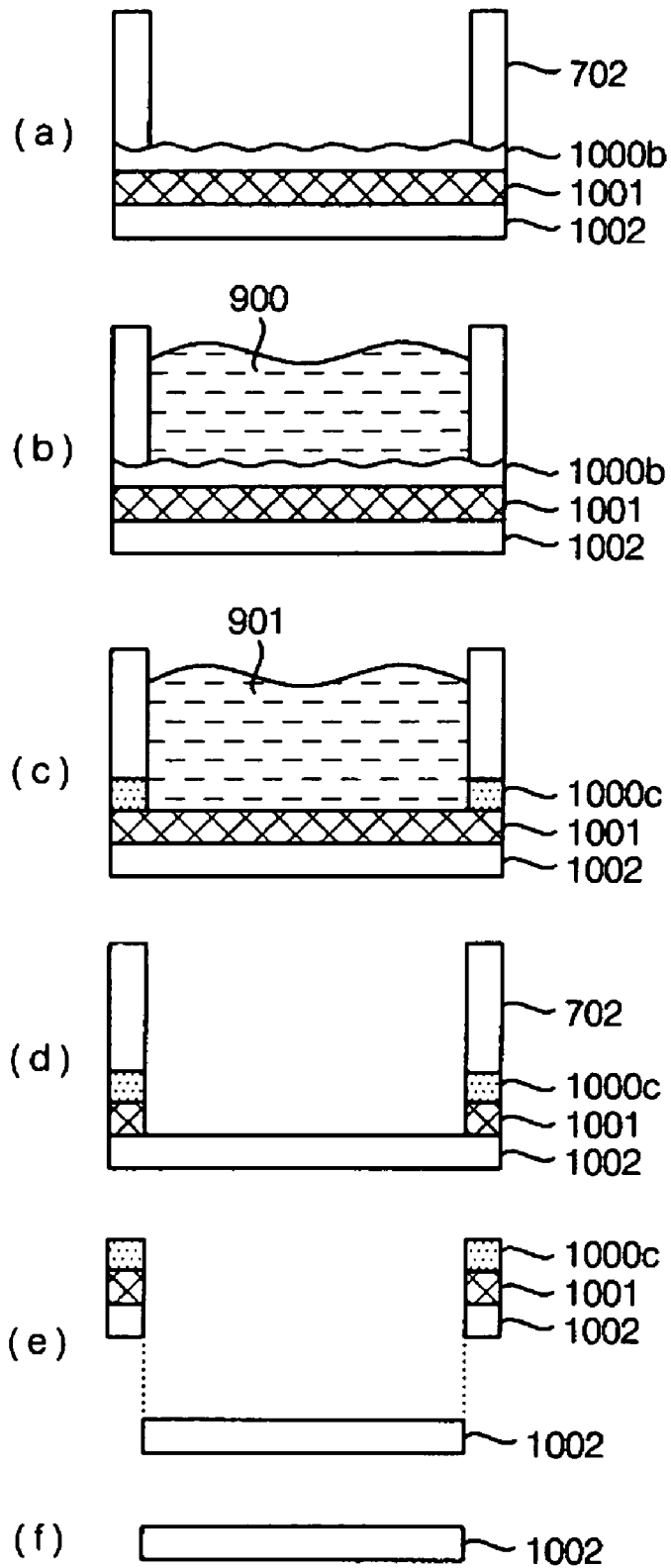

Referring to FIGS. 10 to 11C, the manufacturing process of the flexible single-crystal film by grinding and using the jig according to the present invention is as set forth below.

As shown in FIG. 11A(a), a SOI wafer comprising a base wafer 1000, a buried insulator layer 1001 formed on the base wafer 1000, and a single-crystal layer 1002 of silicon formed on the buried insulator layer 1001 is provided. The thickness of the single-crystal layer is adjusted according to applications.

After a bonding the wax 1005 is coated on the SOI wafer provided as above (FIG. 11A(b)), a supporting wafer 1006 is bonded thereon (FIG. 11A(c)). The wax which is soluble in water may be selected. The supporting wafer 1006 is bonded by vertical or horizontal bonding. In the post grinding process, the supporting wafer protects the SOI wafer and facilitates the process. Preferably, protective insulator layers may be formed on the SOI wafer, prepared as above.

With the supporting wafer 1006 bonded, as shown in FIG. 11A(d), the base wafer 1000 is ground to the desired thickness. The thickness can be desirously adjusted in grinding, for example from 50 µm to 200 µm.

After grinding the base wafer 1000, as shown in FIGS. 11B and 11C, the remaining base wafer 1000b after grinding can be removed by wet etching it using the jig shown in FIG. 7. The supporting wafer 1006 is removed by dissolving the wax with aqueous solutions or a chemical agent after or before removing the remaining base wafer 1000b.

Referring to FIG. 11B, the removal process by etching an entire surface of the base wafer using the jig is as follows.

As shown in FIG. 11B(a), the edges of the SOI wafer is held with the jig so that the entire surface of the remaining base wafer 1000b to be removed by etching is exposed to the bath 702 of the upper plate 701.

A KOH solution 900 is supplied onto the exposed surface of the remaining base wafer 1000b so that the base wafer is removed by etching as shown in FIG. 11B(b). By draining the KOH solution 900 from and supplying a HF solution 901 onto the exposed surface, the insulator layer 1001 is removed by etching it (FIG. 11B(c)). After draining the HF solution 901, the pure, flexible, single-crystal film of silicon is obtained by removing the wax 1005 and the supporting wafer 1006 (FIG. 11B(d)(e)). The supporting wafer 1006 may be removed before removing the remaining base wafer 1000b.

By etching only with the KOH in the steps described above, the flexible film including the insulator layer and the single-crystal layer of silicon can be obtained.

Referring to FIG. 11C, the removal process by etching a portion of the base wafer using the jig will be explained in more detail as below. If the flexible film is manufactured by such a method according to the present invention, it is not necessary to wet etch a peripheral of a wafer. That is, the flexible film of the desired shape can be manufactured by etching the necessary portion of the wafer using the jig, wherein the shape of the through hole of the bath is changed to a shape of a desired portion, and by cutting the unnecessary peripheral of the wafer, which is not etched. The wax 1005 and the supporting wafer 1006 may be removed before the etching process in order to avoid the cutting process of the supporting wafer 1006. Otherwise, after the etching process, the supporting wafer 1006 may be removed before cutting the unnecessary peripheral of the wafer.

After grinding the base wafer 1000 to the desired thickness as described above, the supporting wafer 1006 is removed by dissolving the wax with aqueous solutions or a chemical agent. After removing the supporting wafer 1006, the jig is positioned and pressed on the peripheral portion of the wafer so that a portion of the base wafer to be removed by etching is exposed (see FIG. 11C(a)).

The KOH solution 900 is supplied onto the exposed surface of the remaining base wafer 1000b so that the base wafer is removed by etching as shown in FIG. 11C(b). By draining the KOH solution from and supplying the HF solution onto the exposed surface, the insulator layer is removed by etching (see FIG. 11C(c)). The peripheral portion 1000c of the base wafer, not removed by etching, is cut (FIG. 11C(e)), so that the pure, flexible single-crystal film of silicon is obtained (FIG. 11C(f)).

Also, by etching only with the KOH in the steps described above and cutting the peripheral portion 1000c of the base wafer, the flexible film including the insulator layer and the single-crystal layer of silicon can be obtained.

Embodiment 5

Figure 12:
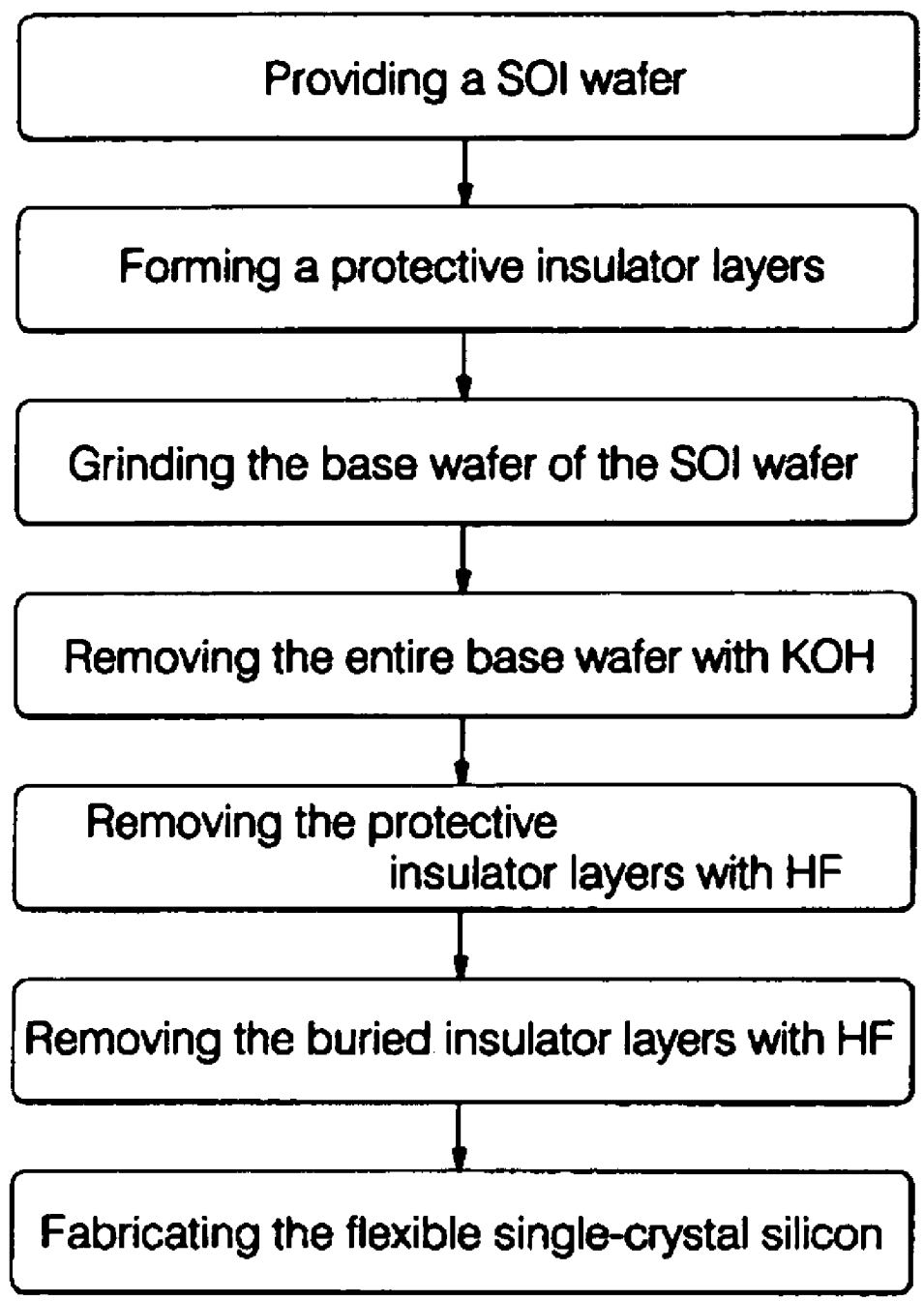
FIG. 12 shows a flow chart for manufacturing a flexible film according to Embodiment 5 of the present invention.
Figure 13A:
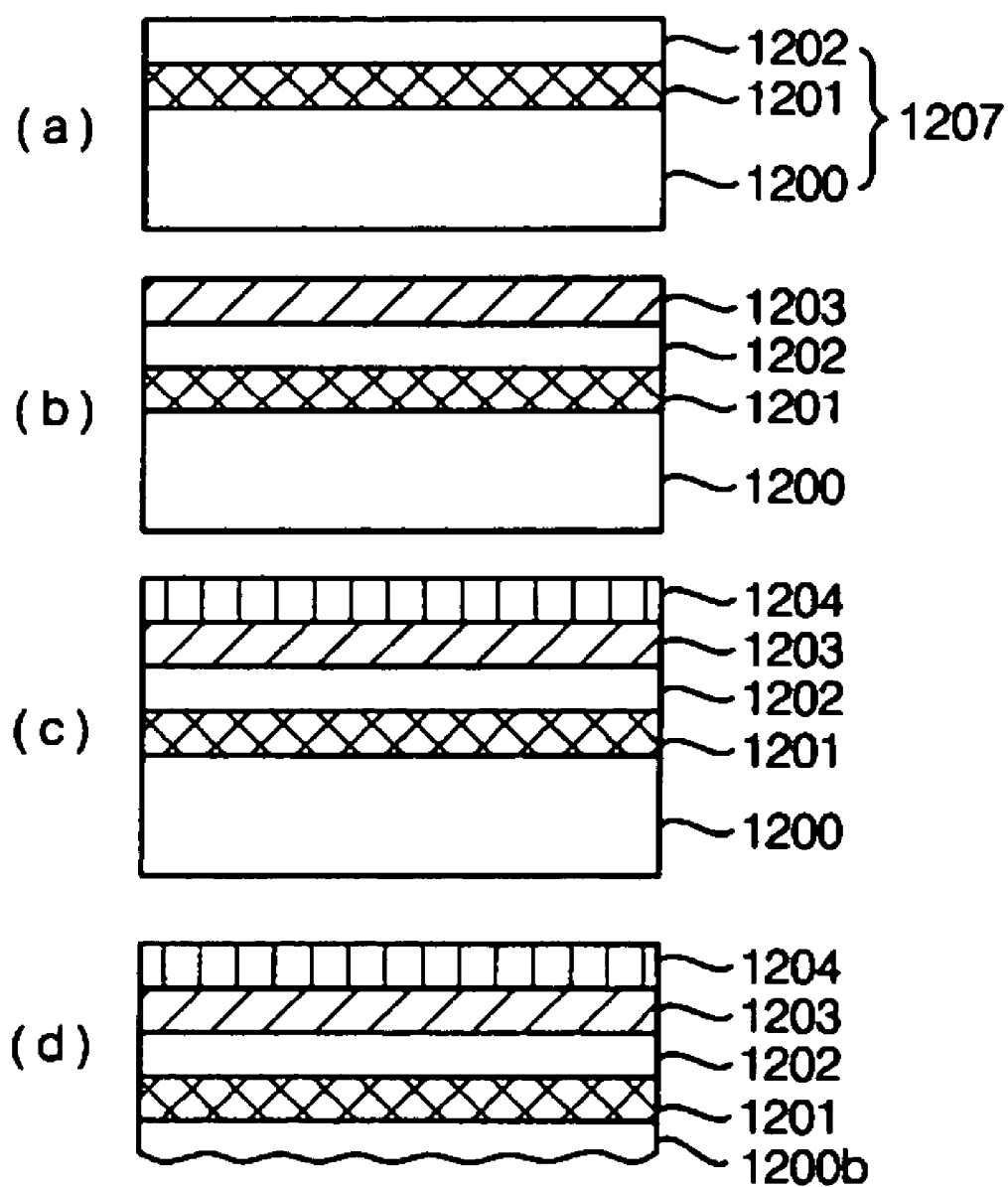
FIGS. 13A and 13B show views of the manufacturing process of a flexible film according to Embodiment 5 of the present invention.
Figure 13B:
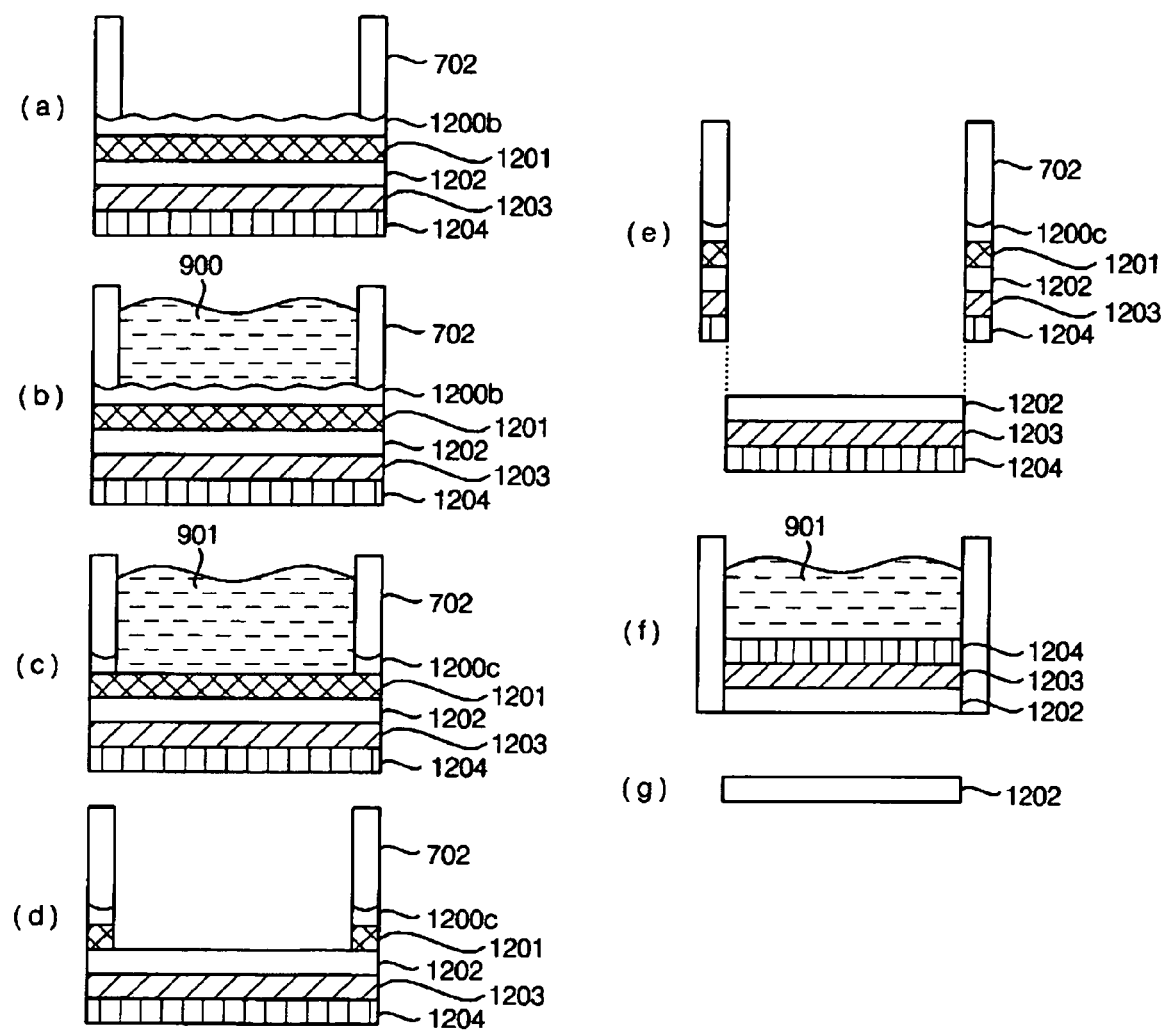

Referring to FIGS. 12 to 13B, another embodiment of the manufacturing process of the flexible single-crystal film according to the present invention will be explained in more detail as below. The present embodiment is similar to Embodiment 4, except that the supporting wafer is not bonded on the SOI wafer.

As shown in FIG. 13A(a), a SOI wafer comprising a base wafer 1200, a buried insulator layer 1201 formed on the base wafer 1200, and a single-crystal layer 1202 of silicon formed on the buried insulator layer 1001 is provided. The thickness of the single-crystal layer is adjusted according to applications.

Protective insulator layers are formed on the SOI wafer provided as above. The protective insulator layers, which protect the single-crystal layer of silicon from being etched when the base wafer is removed by wet etching, includes an oxide film 1203 (FIG. 13A(b)) and a nitride film 1204 (FIG. 13A(c)) thereon.

After the protective insulator layers are formed on the SOI wafer, the base wafer 1200 is ground to the desired thickness (FIG. 13A(d)). Since the supporting wafer is not bonded on the SOI wafer in the present embodiment, the SOI wafer may be fractured in a chuck of a grinding machine. Therefore, the thickness of the remaining base wafer after grinding should be thick. That is, the thickness of above 150 μm can be desirously adjusted in grinding.

After grinding the base wafer 1200, as shown in FIG. 13B, the remaining base wafer 1200b can be removed by wet etching it using the jig shown in FIG. 7.

FIG. 13B shows the removal process by etching a portion of the base wafer using the jig. If the flexible film is manufactured by such a method according to the present invention, it is not necessary to wet etch a peripheral of a wafer. That is, the flexible film of the desired shape can be manufactured by etching the necessary portion of the wafer using the jig, wherein the shape of the through hole of the bath is changed to a shape of desired portion, and by cutting the unnecessary peripheral of the wafer, which is not etched.

After grinding the base wafer 1200 to the desired thickness as shown in FIG. 13A(g), the jig is positioned and pressed on the peripheral portion of the wafer so that a portion of the base wafer to be removed by etching is exposed (see FIG. 13B(a)).

The KOH solution 900 is supplied onto the exposed surface of the base wafer so that the base wafer is removed by etching as shown in FIG. 13B(b). By draining the KOH solution from and supplying the HF solution onto the exposed surface, the insulator layer 1201 is removed by etching (see FIG. 13B(c)(d)). By etching only with the KOH in the steps described above, the flexible film including the insulator layer and the single-crystal layer of silicon can be obtained.

After removing the insulator layer 1201, the wafer including the protective insulator layers and the single-crystal layer of silicon is obtained by cutting the peripheral portion of the wafer, not removed by etching (see FIG. 13B(e)). In order to remove the protective insulator layers 1203, 1204, the wafer is overturned and held with the jig so that the entire surface of the protective insulator layer 1204 is exposed. Then, the pure, flexible single-crystal film of silicon is obtained by etching the protective insulator layers 1203, 1204 with HF 901.

The removal of the buried insulator layer 1201 and the protective insulator layers 1203, 1204 with the HF solution may be performed by dipping the entire wafer without the jig in the HF solution.

Although the present embodiment describes the method for removing the remaining base wafer after grinding by holding the peripheral portion of the wafer with the jig, etching a portion of the base wafer, and cutting the peripheral portion, the remaining base wafer after grinding may be removed by holding the edges of the wafer with the jig to expose the entire surface of the remaining base wafer and etching it.

Embodiment 6

Figure 14:
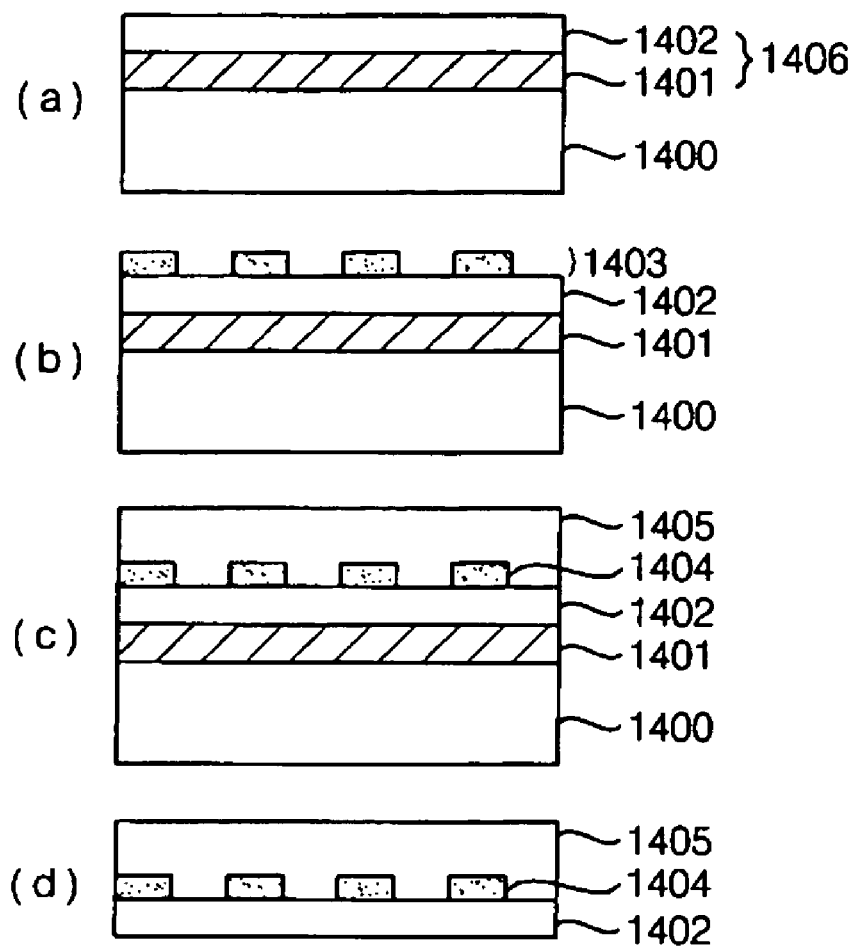
FIG. 14 shows views of the manufacturing process of a flexible film according to Embodiment 6 of the present invention.
Figure 15:
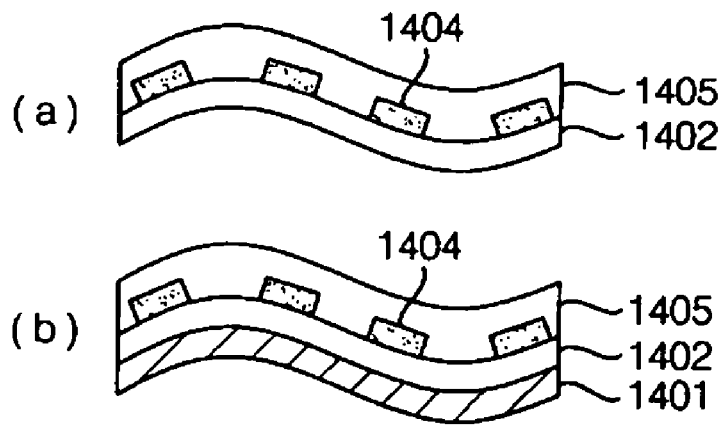
FIG. 15 shows views of a flexible film manufactured according to Embodiment 6 of the present invention.

Referring to FIGS. 14 and 15, the manufacturing process of the flexible single-crystal film according to the present invention will be explained in more detail as below.

As shown in FIG. 14(a), a SOI wafer 1406 comprising a base wafer 1400, an insulator layer 1401 formed on the base wafer, and a single-crystal layer 1402 of silicon formed on the insulator layer is prepared.

Various electronic devices are manufactured on the single-crystal layer of the SOI wafer as prepared above by using a general semiconductor manufacturing process (see FIG. 14(b)). These electronic devices 1404 are manufactured according to the desired objectives. That is, these electronic devices may be designed according to the characteristics of various transistors, TFT arrays, logical circuits, and the like, and manufactured by a semiconductor manufacturing process.

A protective film 1405 for the devices is formed on the device layer on which various electronic devices are manufactured (see FIG. 14(c)). The protective film 1405 can be a general passivation film, an organic matter insulator layer, and the like.

The flexible film is obtained by removing the base wafer 1400 from the SOI wafer on which the devices are manufactured (see FIG. 14(d)). The removal of the base wafer can be performed by the methods according to Embodiments 1 to 5.

As shown in FIG. 15, the flexible film manufactured as above is flexible enough with the desired electronic devices manufactured on the single-crystal of silicon. FIG. 15(a) shows the flexible film wherein the devices are manufactured on the pure single-crystal of silicon, while FIG. 15(b) shows the flexible film wherein the devices are manufactured are formed on the flexible film including the insulator layer and the single-crystal layer of silicon and wherein the insulator layer protects the single-crystal layer of silicon and the devices during handling.

The flexible single-crystal film of the present invention as described thus far enables the devices of desired characteristics to be manufactured thereon and allows for overall flexibility Particularly, the flexible single-crystal film can be easily manufactured using the single-crystal wafer.

According to the present invention, the flexible film wherein desired various electronic devices are manufactured on the single-crystal layer is simply and stably manufactured. The present invention can realize the desired characteristics of electronic devices. By manufacturing various electronic devices on the single-crystal layer, an active layer for the devices is formed from the single-crystal layer. By using a semiconductor manufacturing process, a very high electronic mobility of 1000 $cm^2$/Vsec is achieved. As such, electronic devices possess superior characteristics, and leakage current is also considerably reduced. It is possible to reduce the size of various electronic devices to the level of general semiconductor devices. It is also possible to design circuits with a design rule of about 30 nm, which can be practicable at present, by a stable high-temperature process and semiconductor photolithographic and etching process having good alignment accuracy, since the semiconductor manufacturing process is applied to silicon wafers.

Since the present invention can use a stable channel device of single-crystal, the present invention enables an SOP (system on panel), where all driver circuits are embedded in the panel, and embedded devices, where various memories, system ICs, processors, specific semiconductor circuits, and the like are embedded in a chip according to device purpose, to be flexible.

Using an appropriate thinning method, it is possible to manufacture the flexible single-crystal film and to improve productivity and reduce the cost of production by simplifying the manufacturing process of the flexible single-crystal film.

Although the present invention is described in detail with the embodiments, the invention is not limited thereto and can be changed or modified by those skilled in the art within the spirit and scope of the invention.

The present application contains subject matter related to Korean Patent Application Nos. KR 10-2003-0027825 and 10-2003-0032841, filed in the Korean Intellectual Property Office on Apr. 30 and May 23, 2003, respectively, the entire contents of which are incorporated herein by reference.

What is claimed is:

1. A method for manufacturing a flexible film, the method comprising:
   providing a SOI wafer comprising a base wafer, one or more insulator layers on the base wafer, and a single-crystal layer on the one or more insulator layers;
   holding the SOI wafer with a jig to expose a first surface of the base wafer of the SOI wafer; and
   removing the base wafer of the SOI wafer by etching the exposed first surface of the base wafer while holding the SOI wafer with the jig to form the flexible film,
   wherein the flexible film is provided with a flexibility capable of bending.

2. The method according to claim 1, wherein holding the SOI wafer comprises holding edges of the SOI wafer with the jig to expose the entire first surface of the base wafer.

3. The method according to claim 2, wherein an area of the first surface of the base wafer is defined by an edge surface of the base wafer, the method further comprising holding the SOI wafer with the jig by contacting the edge surface of the base wafer with the jig.

4. The method according to claim 1, wherein holding the SOI wafer comprises holding a peripheral portion of the SOI wafer with the jig to expose a portion if the first surface of the base wafer.

5. The method according to claim 4, wherein removing the base wafer comprises cutting the peripheral portion which is held by the jig.

6. The method according to claim 4, which further comprises holding the SOI wafer by pressing the jig against a peripheral portion of the first surface of the base wafer.

7. The method according to any one of claims 1 to 5, wherein removing the base wafer comprises wet etching it.

8. The method according to claim 7, wherein KOII is used in wet etching the base wafer.

9. The method according to claim 7, further comprising removing one or more of the insulator layers by wet etching them with HF.

10. The method according to claim 9, wherein removing one or more of the insulator layers by wet etching them with HF comprises dipping the SOI wafer with the jig detached in an etching solution.

11. The method according to claim 1, wherein the jig extends above the first surface of the base wafer to define an etchant-receiving space, wherein the first surface of the base wafer is exposed to the etchant-receiving space, and wherein removing the base wafer includes disposing a first wet etchant within the etchant-receiving space.

12. The method according to claim 11, wherein removing the base wafer includes exposing at least one insulator layer within the etchant-receiving space, the method further comprising disposing a second wet etchant within the etchant receiving space to remove the at least one insulator layer exposed within the etchant receiving space.

13. The method according to claim 11, wherein a shape of the flexible film corresponds to a shape of the etchant-receiving space.

14. The method according to claim 1, wherein the single-crystal layer has a thickness of 100 to 1000 nm.

* * * * *